(12) United States Patent
Waffenschmidt

(10) Patent No.: US 6,903,938 B2
(45) Date of Patent: Jun. 7, 2005

(54) PRINTED CIRCUIT BOARD

(75) Inventor: Eberhard Waffenschmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 67 days.

(21) Appl. No.: 10/213,576

(22) Filed: Aug. 7, 2002

(65) Prior Publication Data

US 2003/0030533 A1 Feb. 13, 2003

(30) Foreign Application Priority Data

Aug. 11, 2001 (DE) .......................... 101 39 707

(51) Int. Cl.[7] .............. H05K 7/02; H05K 7/06; H05K 7/08; H05K 7/10
(52) U.S. Cl. .................. 361/779; 361/792; 336/200
(58) Field of Search ................. 361/764–766, 361/792–795; 336/200, 232

(56) References Cited

U.S. PATENT DOCUMENTS

| 5,466,892 A | * | 11/1995 | Howard et al. | ............. 174/261 |
| 5,990,776 A | * | 11/1999 | Jitaru | ......................... 336/200 |
| 6,356,455 B1 | * | 3/2002 | Carpenter | ................... 361/793 |
| 6,380,608 B1 | * | 4/2002 | Bentley | ....................... 257/531 |
| 6,388,636 B1 | * | 5/2002 | Brown et al. | ............... 343/866 |

FOREIGN PATENT DOCUMENTS

JP 024193 1/2001 .......... H01L/29/78

* cited by examiner

Primary Examiner—Kamand Cuneo
Assistant Examiner—Tuan Dinh

(57) ABSTRACT

The invention relates to a printed circuit board comprising capacitive and inductive elements. To arrange such a printed circuit board so that it has a smaller thickness and can be manufactured cost effectively, a printed circuit board is proposed having at least one dielectric layer, on the two side faces of which capacitor electrodes arranged opposite each other are positioned in a first area and two planar windings opposite each other are arranged in at least a second area next to the first area on the side faces of the electric layer.

14 Claims, 7 Drawing Sheets

PRINTED CIRCUIT BOARD

Figure 1:
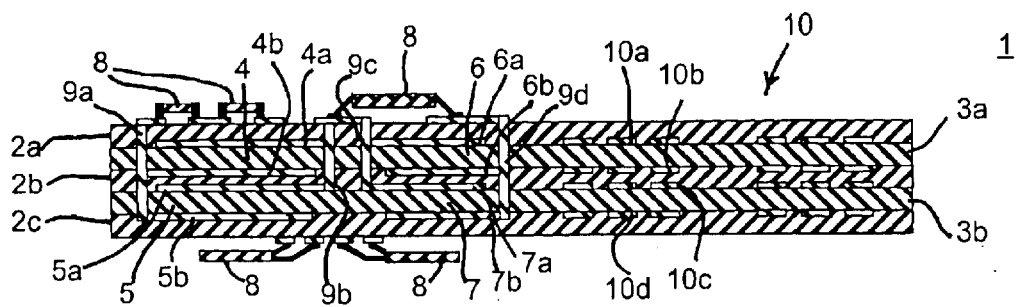

U.S. Pat. No. 5,990,776 describes a multilayer printed circuit board with planar coil and transformer windings being arranged on various inside printed circuit board layers. By utilizing planar windings, thin printed circuit boards can be made because inductive circuit elements such as coils and transformers mounted on the surface are no longer necessary. U.S. Pat. No. 5,990,776 further describes low-magnetic cores passing through the printed circuit board, which convey the magnetic flux of the planar coil and transformer windings.

It is an object of the invention to provide a printed circuit board which comprises capacitive and inductive components which all have a small thickness and can be manufactured cost effectively.

The object is achieved by a multilayer printed circuit board with at least one dielectric layer on whose two side faces capacitor electrodes are arranged opposite one another in a first area and in at least a second area next to the first area two oppositely deposited planar windings are arranged.

In this printed circuit board preferably manufactured via lamination, a dielectric layer consisting of material with an enhanced dielectric constant and suitable as a capacitor dielectric can extend to areas in which planar windings occur for inductive circuit elements, LC circuit elements (L: inductance function, C: capacitance function) or also LCT circuit elements (L: inductance function; C: capacitance function; T: transformer function). A dielectric layer may also extend across the whole printed circuit board. Capacitive circuit elements also evolve in the second area which is additionally used for realizing inductive circuit elements. As a result, the number of necessary layers of printed circuit boards can be reduced because windings for inductive circuit elements are arranged directly on the side faces of a dielectric layer so that no additional layer is necessary for these windings. The integration of inductive and capacitive circuit elements in the second area also provides a reduction of the width of the printed circuit board. The manufacturing process is simplified and sources of errors during the manufacture of the printed circuit board are eliminated. Furthermore, the invention provides improved EMI properties (electromagnetic interference) of the printed circuit board. Also insulating layers (claim 2) and further dielectric layers can be provided and a second area may have a plurality of planar windings depending on the circuit requirements. It is also possible to provide a plurality of second areas.

The claims 3 to 5 give several variants of embodiments for the planar windings of the second area. For example, they work as an LC element when they are also used as capacitor electrodes with which the dielectric layer meshes. A further possibility of variation is the variation of the winding orientations.

Claim 6 describes a characteristic feature for expanding the function of the planar windings of the second area to an LCT element, the third planar winding and, if necessary, further third planar windings forming a transformer winding. The claims 7 to 10 describe variants with magnetic core portions which improve the EMI properties of the printed circuit board. They are formed, for example, by core portions fed through the printed circuit board. Resistor elements as well as semiconductor components and CMC capacitors can additionally be disposed on the inside of the printed circuit board (claims 11 and 12). One layer can perform various functions such as shielding or forming low-magnetic core portions by means of a layer of low-magnetic material which has such a structure that subareas of the layer are at least partly separated from each other (for example, by slots or holes).

The subject matter of claim 14 which may also be considered an independent innovative idea, describes the use of layers of magnetic material for the formation of magnetic components and also the formation of resistive components.

These and other aspects of the invention are apparent from and will be elucidated with reference to the embodiments described hereinafter.

Figure 2:
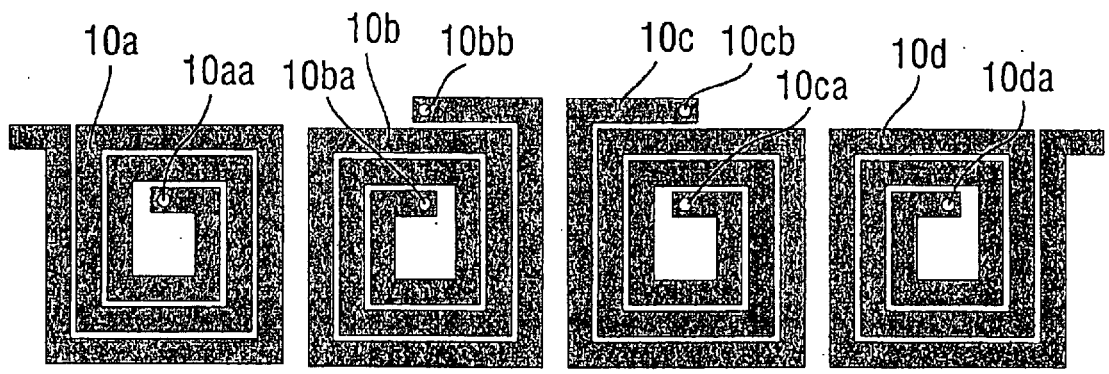
Figure 3:
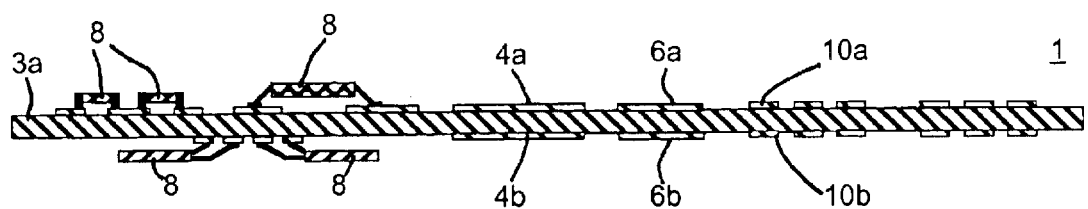
Figure 4:
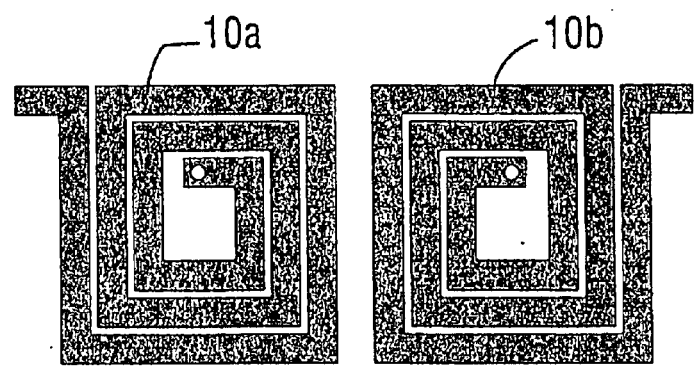
Figure 5:
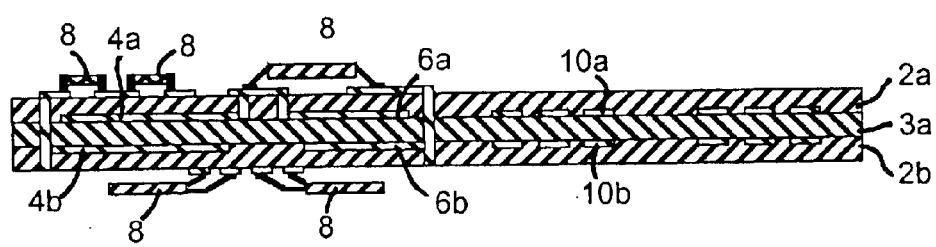
Figure 6:
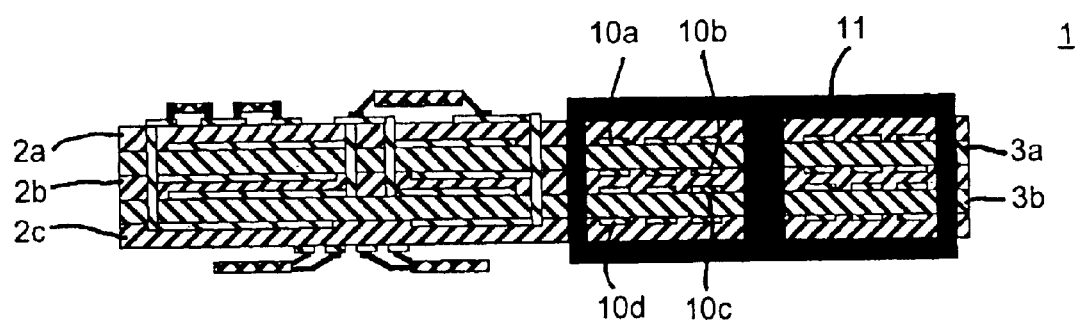
Figure 7:
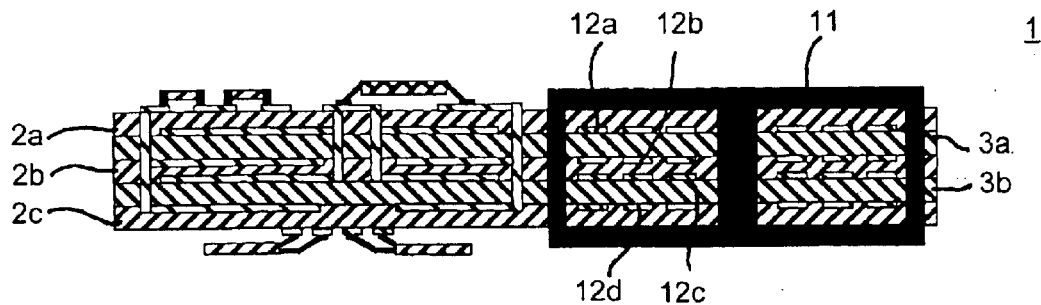
Figure 8:
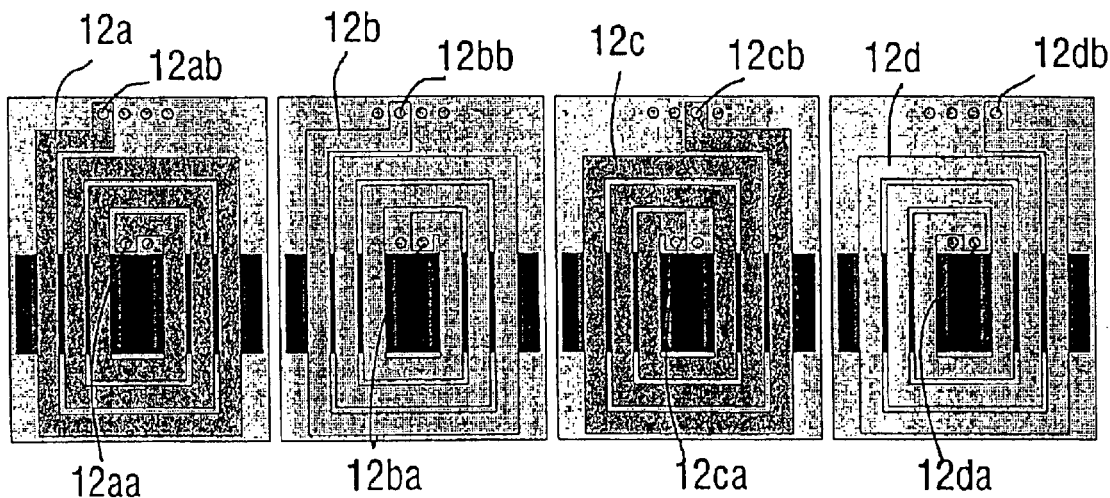
Figure 9:
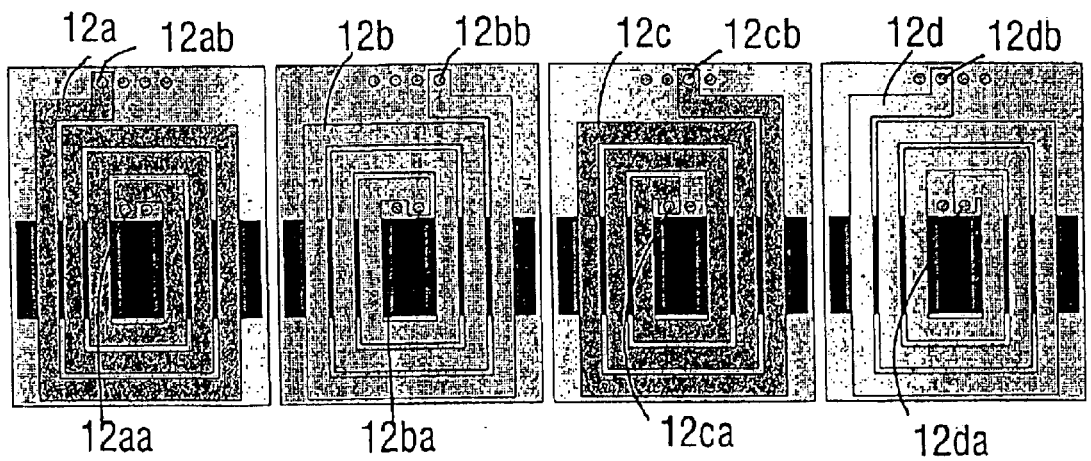
Figure 10:
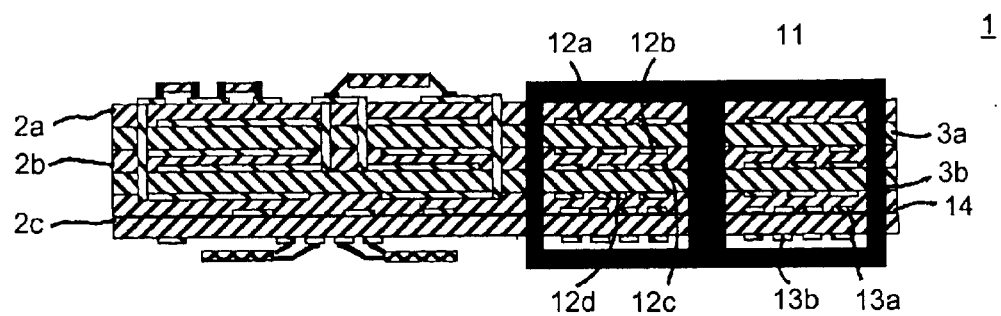
Figure 11:
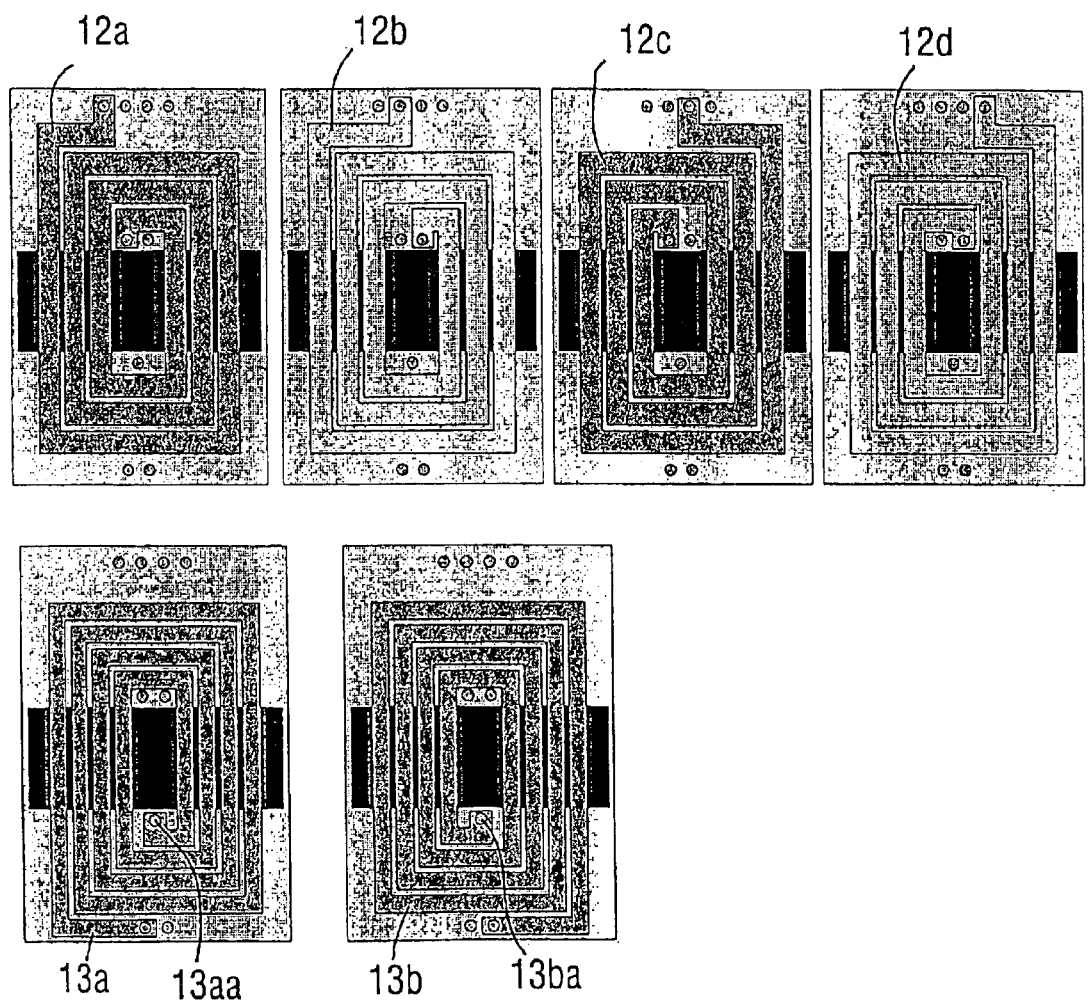
Figure 12:
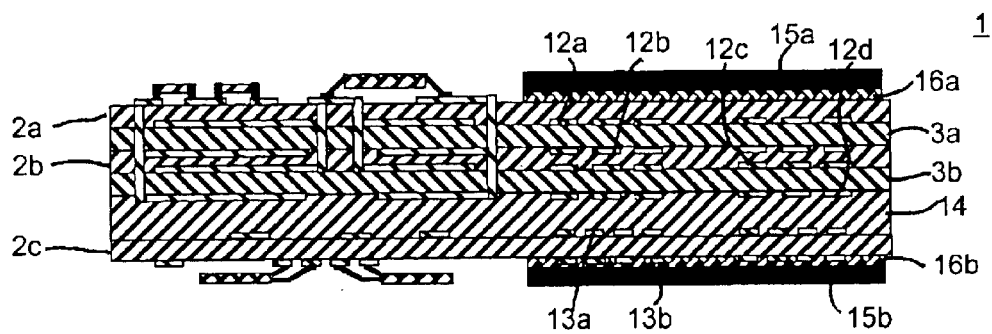
Figure 13:
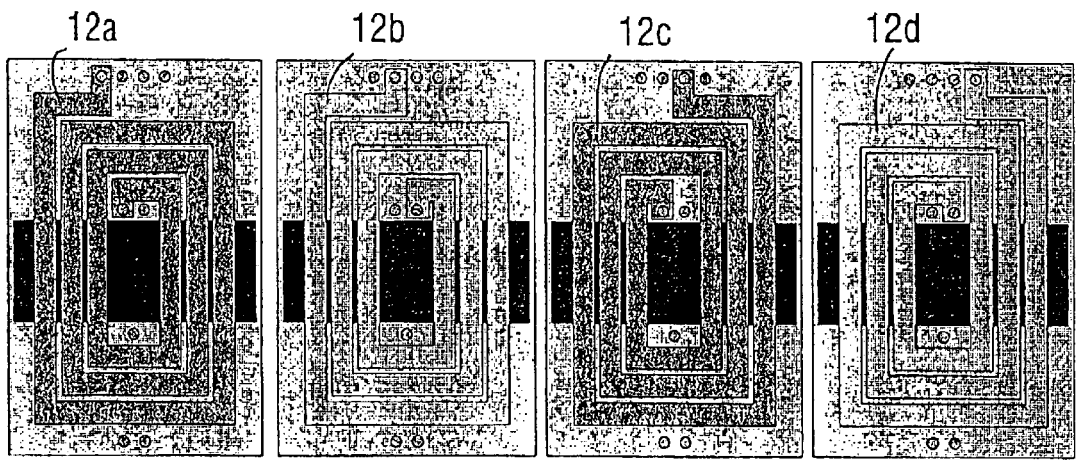
Figure 13:
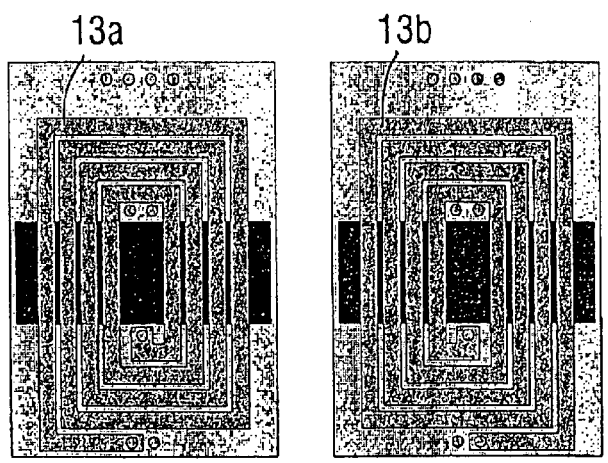
Figure 14:
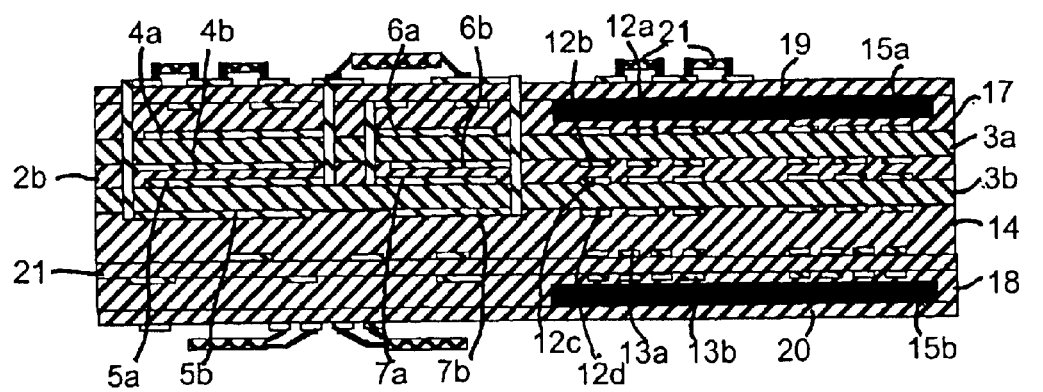
Figure 15:
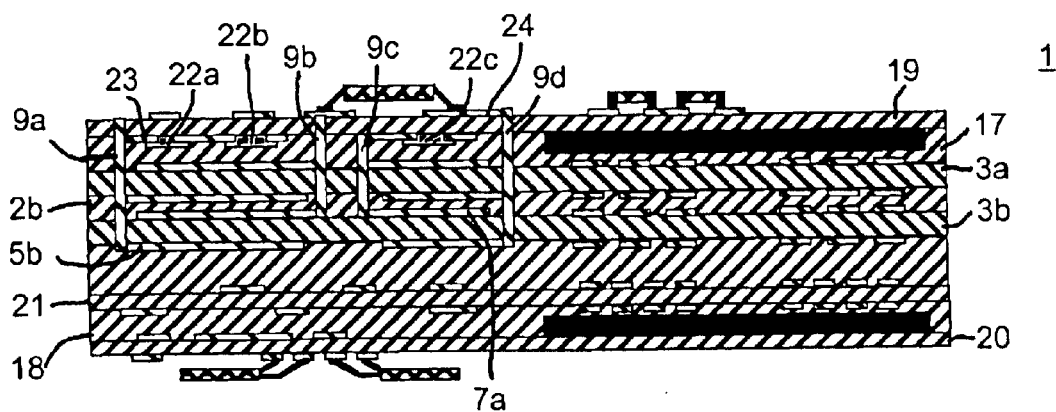
Figure 16:
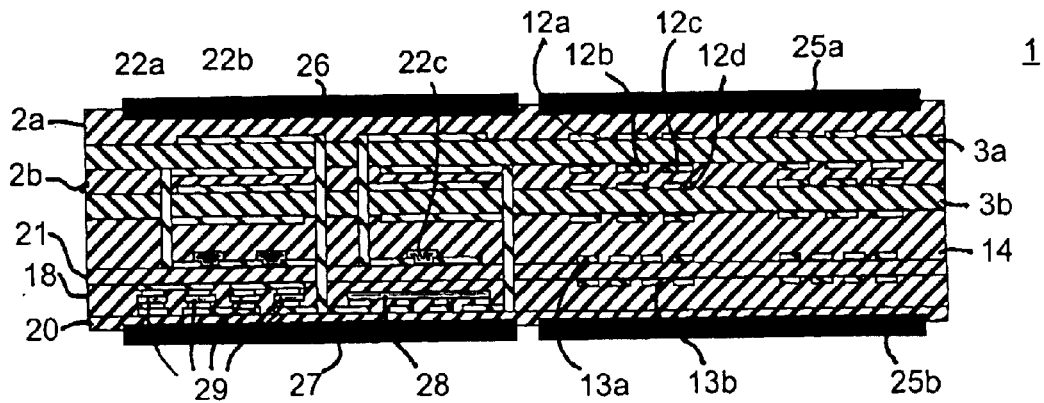
Figure 17:
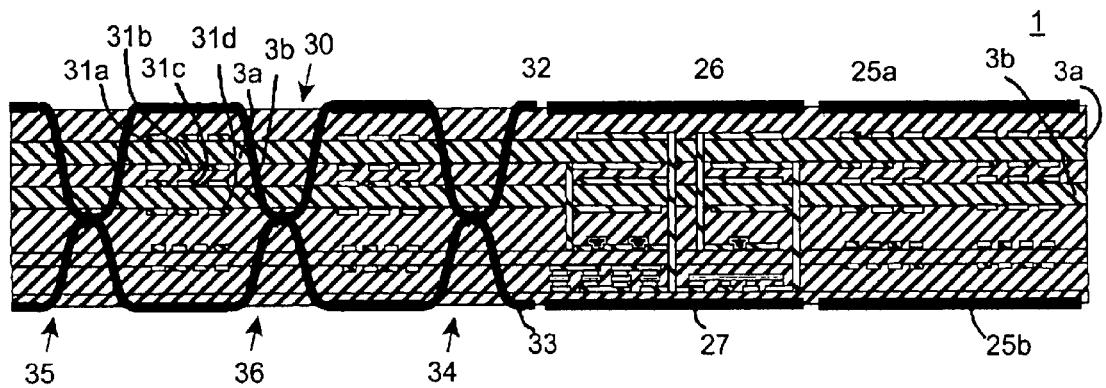
Figure 18:
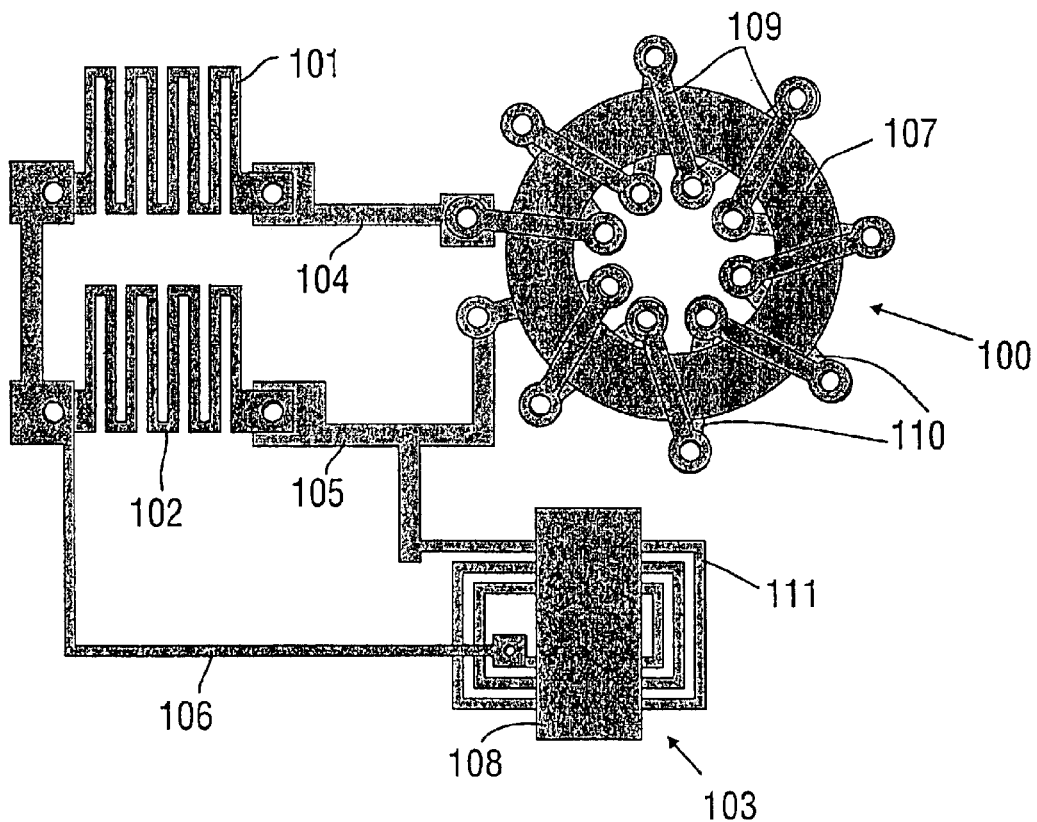

In the drawings:

FIG. 1 shows a cross-sectional view of a first example of a printed circuit board according to the invention, FIG. 2 shows a plan view of planar coil windings used in the printed circuit board shown in FIG. 1, FIG. 3 shows a cross-sectional view of a one-layer embodiment of the printed circuit board, FIG. 4 shows a plan view of a winding arrangement for the printed circuit board shown in FIG. 3, FIG. 5 shows a cross-sectional view of the three-layer embodiment of the printed circuit board, FIG. 6 shows a cross-sectional view of the printed circuit board with core, FIG. 7 shows a cross-sectional view of the printed circuit board with core and LC element, FIG. 8 shows a plan view of a first winding arrangement for the printed circuit board shown in FIG. 4, FIG. 9 shows a plan view of a second winding arrangement for the printed circuit board shown in FIG. 4, FIG. 10 shows a cross-sectional view of the printed circuit board with an LCT element, FIG. 11 shows a plan view of a winding arrangement for the printed circuit board shown in FIG. 7, FIG. 12 shows a cross-sectional view of the printed circuit board with planar core portions, FIG. 13 shows a plan view of a winding arrangement for the printed circuit board shown in FIG. 9, FIG. 14 shows a cross-sectional view of the printed circuit board with embedded planar core portions, FIG. 15 shows a cross-sectional view of the printed circuit board with additional embedded resistor elements, FIG. 16 shows a cross-sectional view of the printed circuit board with additional embedded semiconductor components, FIG. 17 shows a cross-sectional view of the printed circuit board with an additional filter, and FIG. 18 shows an example of a circuit layout with magnet cores and resistors of the same material.

The laminated multilayer printed circuit board 1 shown in a cross-sectional view in FIG. 1 has three insulating layers 2a, 2b and 2c. Between the outside insulating layers 2a and 2c and the inside insulating layer 2b are arranged dielectric layers 3a and 3b which stretch out over the whole width of the printed circuit board 1. A dielectric layer in the sense of this application is meant to be a layer with a suitably high dielectric constant for the application as dielectric in capacitors. In a first area of the printed circuit board 1 are arranged a plurality of capacitor electrodes 4a, 4b, 5a, 5b, 6a, 6b, 7a and 7b. The electrode pairs 4a/4b, 5a/5b, 6a/6b and 7a/7b facing one another are used for forming four capacitors 4, 5, 6 and 7. The electrode pairs 4a/4b and 6a/6b are disposed side by side on the dielectric layer 3a. The electrode pairs 5a/5b and 7a/7b are disposed side by side on the dielectric layer 3b. The upper side and under side of the printed circuit board 1 accommodate circuit structures with SMD components 8, several of which are shown by way of example. The electrical connections between the capacitors 4, 5, 6 and 7 and the circuit structures with the components 8 are provided as through-holes clad on the inside by electrically conductive material, so-called vias 9a, 9b, 9c and 9d, in the present example of embodiment the via 9a being connected to the electrodes 4b and 5b, the via 9b to the electrodes 4a and 5a, the via 9c to the electrodes 6a and 7a and the via 9d to the electrodes 6b and 7b. The capacitors 4 to 7 are integrated for example, with a controller circuit of a power supply circuit or are used as filter capacitors to reduce EMI.

A coil 10 is accommodated in a second area situated on the right beside the first area on the printed circuit board 1. The coil 10 comprises series-arranged planar windings 10a, 10b, 10c and 10d which are shown in FIG. 2 and which have here three helical windings; by means of a respective via (not shown) the contact point 10aa is electrically connected to the contact point 10ba, the contact point 10bb to the contact point 10cb and the contact point 10ca to the contact point 10da. The windings 10a and 10b are disposed on the dielectric layer 3a. The windings 10c and 10d are disposed on the dielectric layer 3b. The dielectric layers 3a and 3b thus extend into the area between the planar windings 10a and 10b; 10c and 10d, respectively. In this manner, a parallel resonant circuit is developed which can be used, for example, in converter circuits (voltage converter circuits) as part of a filter (for example, bandpass filter) or in resonant or quasi-resonant converters without a power switch (for example, boost converter, down-converter).

FIG. 3 shows the printed circuit board 1 in a one-layer embodiment in which only one layer 3a is provided made of dielectric material which at the same time is used as a carrier for the circuit elements of the printed circuit board 1. The capacitor electrode pair 4a and 4b and the capacitor electrode pair 6a and 6b, which are arranged on the upper side or under side respectively of the printed circuit board facing planar windings 10a and 10b as well as the further components 8 are shown. A plan view of the planar windings 10a and 10b is shown in FIG. 4 where the windings are arranged unidirectionally, so that the winding currents can flow counterclockwise when a current flows.

In the example of embodiment shown in FIG. 5 the printed circuit board 1 has three layers, the upper side of the dielectric layer 3a accommodating the insulating layer 2a and the under side of the dielectric layer 3a the insulating layer 2b. The capacitor electrode pair 4a and 4b and the capacitor electrode pair 6a and 6b as well as the planar windings 10a and 10b are arranged on the inside of the printed circuit board 1 as shown in FIG. 1 between the outside insulating layers 2a and 2b and the inside dielectric layer 3a. The components 8 are disposed on the upper side and under side and thus on the insulating layers 2a and 2b.

FIG. 6 shows the printed circuit board 1 shown in FIG. 1 with an additional magnet core 11 which is used for increasing the inductance of the coil 10. The core 11 is arranged, for example, as an E core and as a pot core. An air gap may be provided to adjust the inductance and the magnetic flux density.

FIG. 7 shows a variant of the printed circuit board 1 in which an LC element 12 is provided in lieu of coil 10. The LC element 12 has planar windings 12a, 12b, 12c and 12d each having three helical windings here which are shown in the embodiment as unidirectional windings in FIG. 8 and windings of opposite directions in FIG. 9. In FIG. 8 all the currents flow anti-clockwise and in FIG. 9 currents flow anti-clockwise through the windings 12a and 12c and currents through the windings 12b and 12d flow clockwise. The windings 12a, 12b, 12c and 12d have contact points 12aa, 12ba, 12ca and 12da. Contact point 12aa is electrically connected to the contact point 12ca and the contact point 12ba is connected to the contact point 12da by means of a respective via (not shown). Connecting the windings 12a, 12b, 12c and 12d to the further circuit structures of the printed circuit board 1 takes place at the contact points 12ab, 12bb, 12cb and 12db, preferably again through vias.

The windings 12a and 12b as well as 12c and 12d facing each other not only have their inductive effect but also the function of capacitor electrodes, the layer 3a, 3b, respectively, serving as a dielectric.

For example, a use of in-phase reactance coils with integrated push-pull capacitance to reduce EMI in power converters or also the use in a parallel resonant circuit as shown in the embodiment in FIG. 6—but with a considerably higher effective capacitance—can be used as applications of the embodiment shown in FIGS. 7 and 8. A use in series resonant circuits is also possible. Applications are for example, bandpass filters or oscillation circuits for resonant or quasi-resonant power supply converters or the use of the series capacitor as a DC decoupling capacitor.

In the embodiment shown in FIGS. 7 and 9 the following applications are considered, for example: push-pull filters with integrated capacitance to reduce EMI of power converters; converter reactance coils in combination with filter capacitors (for example, for up-converters and down-converters); parallel resonant switching circuits such as in the embodiment shown in FIG. 6—but with a considerably higher effective capacitance; series-to-parallel resonant switching circuits; application to power switching circuits such as oscillation circuits of resonant or quasi-resonant converters.

In the arrangement of the printed circuit board 1 shown in FIGS. 10 and 11, two further planar windings 13a and 13b are provided which are shown in FIG. 8 and here have four windings each. The windings 13a and 13b facing each other are arranged on the upper side and under side of a further insulating layer 14 and connected in series, the contact points 13a and 13ba being electrically connected by vias (not shown). The windings 13a and 13b operate as a secondary winding for the transformer components of the LCT element formed together with the windings 12a, 12b, 12c and 12d, the function of primary windings being performed by the winding pairs 12a–12c and/or 12b–12d depending on the circuit. The central areas of the windings 12a, 12b, 12c, 12d, 13a and 13b are situated on a line along which the land of the magnetic core 11 runs and which is used for leading a magnetic flux through the windings 12a, 12b, 12c, 12d, 13a and 13b. The windings 12a to 12d here run in the same direction as in FIG. 5; the windings running in opposite directions like in FIG. 6 is also possible of course.

The embodiment of the printed circuit board 1 shown in FIGS. 10 and 11 may preferably be used in resonant or quasi-resonant converters, whereas series resonant circuits, parallel resonant circuits and resonant circuits with series and parallel resonance can also be realized. Further applications are push-pull filters or in-phase filters in which the attenuation properties of the filter can be adjusted by means of an impedance connected to the secondary side of the transformer. Via the windings 13a and 13b can also be effected a detection or supply of high-frequency in-phase signals or high-frequency push-pull signals, the signal transmission then being effected via lines conveying supply voltages.

In the embodiment of the printed circuit board shown in FIG. 12, instead of the magnet core 11 fed through the printed circuit board 1, a magnet core comprising two planar magnet core portions 15a and 15b is provided. As magnet core material can be used commercial ferrite plates, plastic-related ferrite (ferroplast, ferrite polymer compound) and NiFe metal coatings (µ-Metal, Permalloy, Vitrovac). The two core portions 15a and 15b are positioned via bonds 16a and 16b on the upper side or under side of the printed circuit board facing the windings 12a to 12d, 13a and 13b. The surface covered by the core portions 15a and 15b is selected so large that a magnetic flux is led around the windings 12a to 12d, 13a and 13b in a way sufficient for the respective application. FIG. 13 shows the arrangement of the planar windings 12a, 12b, 12c, 12d, 13aa and 13b. By avoiding holes through the printed circuit board 1 like when the core 11 is used, problems with a power switch can be reduced. More particularly, the permissible creepage path between primary and secondary side can be reduced considerably.

In the arrangement in FIG. 14 the core portions 15a and 15b are laminated in the printed circuit board 1. The dielectric layer 3a accommodates instead of the layer 2a an insulating layer 17 to carry the core portion 15a. Furthermore, on the insulating layer 14 is deposited instead of the insulating layer 2c an insulating layer 18 to carry the core portion 15b. On the insulating layer 17 is deposited a further insulating layer 19 and on the insulating layer 18 is deposited a further insulating layer 20, the layers 19 and 20 here representing the outside layers of the printed circuit board 1. In this way it is made possible to arrange circuit elements more particularly individual SMD components on the outside surfaces of the printed circuit board 1 also in the area over the core portions 15a and 15b, as this is indicated by the component 21, i.e. additional space is created for such circuit portions. The arrangement of capacitor electrodes 4a, 4b, 5a, 5b 6a, 6b, 7a, 7b on under side and upper side of the dielectric layers 3a and 3b is effected in accordance with the embodiments shown in FIGS. 1 to 13.

FIG. 15 shows a further aspect of the embodiment shown in FIG. 14 in which additionally resistive elements are integrated with the printed circuit board 1, which elements are manufactured by the use of a resistance paste or by structured layers (for example, Omega Ply method). For example, resistor elements 22a, 22b and 22c are shown which are disposed on the layer 17. A connection line 23 interconnects the elements 22a and 22b and is furthermore connected to the via 9a so that an electrical connection to the capacitor electrode 5b is established. The resistor element 22c is electrically connected by means of a connection line 24 to the via 9c and thus to the capacitor electrode 7a.

FIG. 16 shows a variant of the printed circuit board 1, on which, similarly to FIG. 15, two planar magnet core portions are arranged over and underneath the windings 12a, 12b, 12c, 12d, 13a and 13b, that is, the magnet core portion 25a on the upper side of the printed circuit board 1 and the magnet core portion 25b on the under side of the printed circuit board 1. Furthermore, a further planar low-magnetic part 26 is disposed beside the magnet core portion 25a and a further low-magnetic part 27 beside the magnet core portion 25b which low-magnetic parts merely serve as shields so that the larger part of the upper side of the printed circuit board and also the larger part of the under side of the printed circuit board are shielded. In this way EMI problems can be effectively reduced; the parts 25a, 25b, 26 and 27 may also be formed by a single layer of low-magnetic material in which slots or holes are provided for decoupling the various components (for example by punching them out), and may also be provided on the inside of the printed circuit board 1. Furthermore, in this example of embodiment semiconductor components 28 and 29 which are provided on the insulating layer 20 or between the insulating layer 20 and 21, respectively, are integrated with the printed circuit board 1. So-termed flip chip-type semiconductors (component 28) which are extremely flat and thus can be laminated are preferably used. A further possibility is components with electrical contact points on the upper side and under side (components 29) which do not need a housing (which makes better heat dissipation possible) and need not be soldered because the electrical contact is provided by mechanical contact pressure. If so desired the electrical contact can be ensured by the use of contact springs. The resistor elements 22a, 22b and 22c are arranged here between the layers 14 and 21 of the printed circuit board.

FIG. 17 shows the printed circuit board 1 of FIG. 16 extended to the left by a printed circuit board area with an LC component 30 which has a similar structure to the LC component 12 on the printed circuit board in FIG. 4 i.e. whose planar windings are arranged over and underneath the dielectric layers 3a and 3b. The windings 31a, 31b, 31c and 31d of the LC component 30 correspond to the windings 12a, 12b, 12c and 12d. Planar magnet core portions 32 and 33 are provided which stretch out over the LC component 30 and mesh in areas 34 and 35 lying in the proximity of the LC component 30 and also in the central area 36 of the LC component 30 with notches established by milling or punching, so that the distance between the magnetic core portions 32 and 33 in this area is reduced; in the present example the distance is reduced to zero i.e. the magnetic core portions 32 and 33 touch in the areas 34, 35 and 36 so that a magnetic flux produced by the LC element 30 is conveyed in as good a manner as in an E core or cup core. Filling up the notches with material of the magnetic core portions 32 and 33 is possible, on the one hand, by spray molding or also by thermal deformation during lamination (possible with ferroplasting). When µ-metal is used the notches can also be filled by bending the µ-metal layers.

In the FIGS. 1, 3, 5, 6, 7, 10, 12, 13, 14, 15, 16 and 17 it should be considered that the printed circuit board and its components are not shown to scale for clarity. The layers of the printed circuit board and components in accordance with the variants of embodiment are shown excessively wide in vertical direction. Furthermore, the planar windings used can be electrically interconnected in different ways so that several circuit variants arise in this manner.

FIG. 18 shows a further possibility of the embodiment of a laminated multilayer printed circuit board. The circuit components shown by way of example comprise a toroidal core coil 100, resistor elements 101 and 102 and a planar coil 103. A terminal of the toroidal core coil 100 is connected to the resistor element 101 by a strip conductor 104 and the other terminal of the toroidal core coil is connected to the resistor element 102 by a strip conductor 105. The strip conductor 105 also establishes a contact to the planar coil 103 whose other terminal is connected to the resistor elements 101 and 102 by a strip conductor 106. The coil 103 has a planar toroidal core 107 and the planar coil a planar core 108. The windings of the toroidal core coil 100 are in the form of first line sections 109 which are deposited on the upper side of the toroidal core 107 and second line sections 110 which are disposed on the under side of the toroidal core 107. The three-turn winding of the planar coil 103 is referred to as 111.

The various circuit elements of FIG. 18 are formed by three layers: a first copper layer (104, 105, 110, 111), a second copper layer (106, 109) and a layer of magnetic material (101, 107, 108), while insulating layers disposed between the above layers are not shown for reasons of clarity. The toroidal core 107, the core 108 and the resistors 101 and 102 are thus made of the same material i.e. the electrical conductivity of magnetic-material for example $\mu$-metal, iron powder core material, ferrite, plastic-bound ferrite or iron powder or electrosteel)—is used. The resistors 101 are arranged in a meander-like fashion; depending on form and length of the meander the desired resistance can be set. If ferrite is selected to be the magnetic core material, very high-ohmic resistances can be realized; but also $\mu$-metal with a resistance value a hundred times larger than copper is suitable as a material for the magnetic core and the resistor. If magnetic material layers are used and they are not only used for realizing magnetic cores but also for realizing resistors, a more effective utilization of the magnetic material is achieved.

The example of embodiment shown in FIG. 15 only indicates a multiplicity of options for variations. For example, a printed circuit board may obviously comprise a plurality of layers of magnetoresistance material, which forms magnetic elements and resistor elements. The magnetic material may, for example, also be used for sensors with magnetic cores. Additional capacitive layers may be integrated with the printed circuit board or further resistance layers that cannot be used magnetically may be provided. Further layers of the magnetic material which are used only for forming magnetic components are also possible. Structures corresponding to the example of embodiment shown in FIG. 15 may be used both on the customary printed circuit board with epoxy resin substrate and on printed circuit boards with other materials, more particularly ceramics (for example $Al_2O_3$) or semiconductor material (silicon) or flexible printed circuit board foils.

What is claimed is:

1. A printed circuit board, comprising:
    a dielectric layer having two side faces;
    two capacitor electrodes, each of the two capacitor electrodes disposed on a corresponding one of the two side faces of the dielectric layer, the two capacitor electrodes arranged facing each other in a first area;
    two planar windings, each of the two planar windings disposed on a corresponding one of the two side faces of the dielectric later, the two planar windings arranged facing each other in a second area adjacent to the first area; and
    two planar magnetic cores, each of the two planar magnetic cores disposed on and spaced apart from a corresponding one of the planar windings.

2. The circuit board of claim 1, wherein the dielectric layer is positioned between two insulating layers.

3. The circuit board of claim 1, wherein the planar windings positioned in the second area act both inductively and capacitively.

4. The circuit board of claim 1, wherein the two planar windings have unidirectional orientations.

5. The circuit board of claim 1, wherein the two planar windings have winding orientations in opposite directions.

6. The circuit board of claim 1, wherein a third insulating layer is provided, and wherein on at least one side of the third insulating layer in an area facing the first planar winding, at least a further, third planar winding is provided DC-isolated from the first planar winding.

7. The circuit board of claim 1, wherein resistive elements are embedded in the printed circuit board.

8. The circuit board of claim 1, further comprising planar resistive elements, and wherein the two planar magnetic core portions are formed from the same material as each other, and are disposed in a same printed circuit board plane as the planar resistive elements.

9. The circuit board of claim 2, wherein resistive elements are embedded in the printed circuit board.

10. The circuit board of claim 5, wherein the planar windings positioned in the second area act both inductively and capacitively.

11. The circuit board of claim 5, wherein resistive elements are embedded in the printed circuit board.

12. The circuit board of claim 6, wherein the planar windings positioned in the second area act both inductively and capacitively.

13. The circuit board of claim 6, wherein resistive elements are embedded in the printed circuit board.

14. The circuit board of claim 4, wherein the planar windings positioned in the second area act both inductively and capacitively.

* * * * *